(12) United States Patent  
Yoshino et al.

(10) Patent No.: US 7,854,049 B2
(45) Date of Patent: Dec. 21, 2010

(54) METHOD OF MANUFACTURING A PIEZOELECTRIC THIN FILM DEVICE

(75) Inventors: Takashi Yoshino, Ama-Gun (JP); Shoichiro Yamaguchi, Ichinomiya (JP); Yuichi Iwata, Nagoya (JP); Akira Hamajima, Nagoya (JP); Kengo Suzuki, Komaki (JP)

(73) Assignees: NGK Insulators, Ltd., Nagoya-shi (JP); NGK Optoceramics Co., Ltd., Komaki (JP)

( * ) Notice: Subject to any disclaimer, the term of this patent is extended or adjusted under 35 U.S.C. 154(b) by 496 days.

(21) Appl. No.: 11/675,677

(22) Filed: Feb. 16, 2007

(65) Prior Publication Data

US 2007/0199186 A1 Aug. 30, 2007

(30) Foreign Application Priority Data

Feb. 24, 2006 (JP) .............................. 2006-047821

(51) Int. Cl.
*H04R 17/10* (2006.01)
(52) U.S. Cl. .................. 29/25.35; 29/594; 310/312; 310/326
(58) Field of Classification Search ............. 29/25.35, 29/594, 830, 852; 310/311, 324, 326, 328, 310/312
See application file for complete search history.

(56) References Cited

U.S. PATENT DOCUMENTS 3,897,628 A * 8/1975 Hanak et al. ............... 29/25.35

| | | | |
|---|---|---|---|
| 5,771,555 A * | 6/1998 | Eda et al. .................. 29/25.35 |
| 6,445,265 B1 * | 9/2002 | Wright .................. 29/25.35 X |
| 6,992,420 B2 | 1/2006 | Jang et al. |
| 7,432,785 B2 | 10/2008 | Yoon et al. |
| 2004/0207033 A1 | 10/2004 | Koshido |
| 2006/0006768 A1 | 1/2006 | Ishii |

FOREIGN PATENT DOCUMENTS

| CN | 1294780 A1 | 5/2001 |
| CN | 1595798 A1 | 3/2005 |
| JP | 62-008610 A1 | 1/1987 |
| JP | 63082116 A * | 4/1988 |

(Continued)

OTHER PUBLICATIONS

"Chinese and Foreign Technique Information," Dec. 31, 1995, Period 5, pp. 23-24.

*Primary Examiner*—A. Dexter Tugbang
(74) *Attorney, Agent, or Firm*—Burr & Brown (57) ABSTRACT

In a piezoelectric thin film device of the present invention, the degree of flexibility is enhanced in selection of a piezoelectric material constituting a piezoelectric thin film and the crystal orientation in the piezoelectric thin film. A piezoelectric thin film filter, including four film bulk acoustic resonators, has a configuration where a filter section for providing a filter function of the piezoelectric thin film filter is bonded with a flat base substrate mechanically supporting the filter section via an adhesive layer. In manufacturing of the piezoelectric thin film filter, a piezoelectric thin film is obtained by performing removal processing on a piezoelectric substrate, but the piezoelectric thin film obtained by removal processing cannot independently stand up under its own weight. For this reason, a prescribed member including the piezoelectric substrate is previously bonded to the base substrate as a support prior to the removal processing.

6 Claims, 8 Drawing Sheets

FOREIGN PATENT DOCUMENTS

| | | |
|---|---|---|
| JP | 8-18115 | 1/1996 |
| JP | 10-308640 | 11/1998 |
| JP | 2000-151321 | 5/2000 |
| JP | 2000-223996 | 8/2000 |
| JP | 2003-234630 | 8/2003 |
| JP | 2005-094735 | 4/2005 |
| JP | 2006-50592 | 2/2006 |
| KR | 2004-089137 A1 | 10/2004 |
| KR | 0616508 B1 | 8/2006 |

* cited by examiner

METHOD OF MANUFACTURING A PIEZOELECTRIC THIN FILM DEVICE

BACKGROUND OF THE INVENTION

1. Field of the Invention

The present invention relates to a piezoelectric thin film device including a single or a plurality of film bulk acoustic resonators (FBAR), and a method for manufacturing the piezoelectric thin film device.

2. Description of the Background Art

Figure 12:
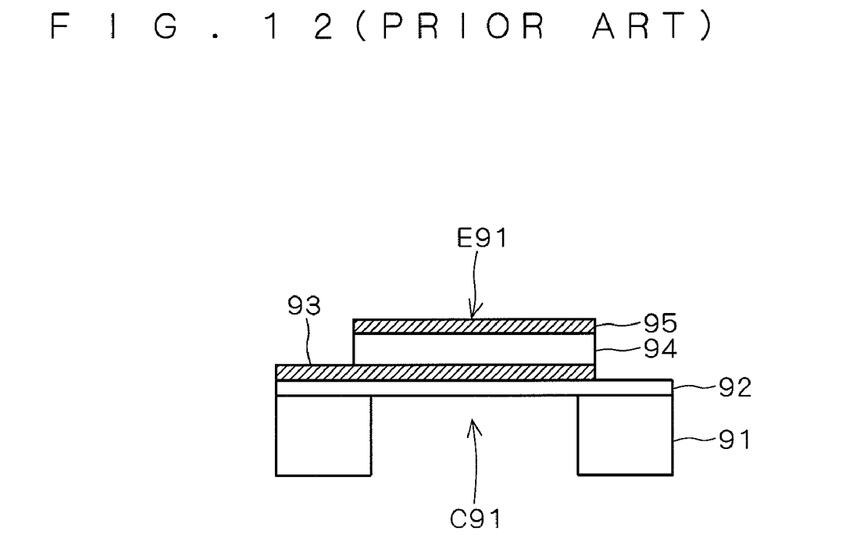
FIG. 12 is a sectional view showing a configuration of a conventional piezoelectric thin film device.
Figure 13:
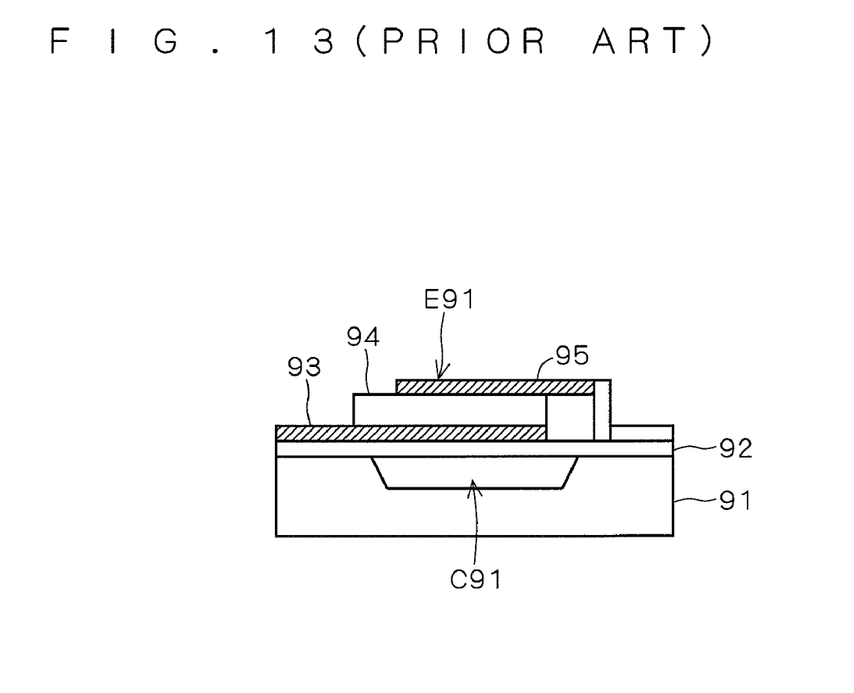
FIG. 13 is a sectional view showing the configuration of the conventional piezoelectric thin film device.

A piezoelectric thin device including a single or a plurality of film bulk acoustic resonators, such as a oscillator, a trap, a filter, a duplexer and a triplexer, has hitherto been manufactured by sequentially forming, on a supporting layer 92 formed on a base substrate 91, a lower electrode 93, a piezoelectric thin film 94, and an upper electrode 95 by sputtering or the like, and then forming a cavity C91 below a excitation region E91 of the piezoelectric thin film 94 by etching or the like (e.g. see Japanese Patent Application Laid-Open No. 2005-94735).

However, in the related art, it is difficult to obtain the piezoelectric thin film device with a desired characteristic since a piezoelectric material constructing the piezoelectric thin film 94 and a crystal orientation in the piezoelectric thin film 94 are limited to one which can be formed on the lower electrode 93. In particular, in the related art, it is difficult to construct the piezoelectric thin film 94 comprising a single-crystal piezoelectric material since the piezoelectric thin film 94 is formed on the lower electrode 93, which is a metal film.

SUMMARY OF THE INVENTION

The present invention relates to a piezoelectric thin film device including a single or a plurality of film bulk acoustic resonators, and a method for manufacturing the piezoelectric thin film device.

According to the present invention, a method for manufacturing a piezoelectric thin film device, including a single or a plurality of film bulk acoustic resonators, comprises: a production process for producing a prescribed member including a piezoelectric substrate; a bonding process for bonding the member to a support; and a removal process for performing removal processing on the piezoelectric substrate while keeping the member in the state of being bonded to the support, to obtain a piezoelectric thin film.

Herewith, the degree of flexibility is enhanced in selection of a piezoelectric material constituting the piezoelectric thin film and the crystal orientation in the piezoelectric thin film, thereby facilitating the realization of a piezoelectric thin film device having a desired characteristic.

It is preferable that the removal process comprise a grinding process for performing grinding processing on the piezoelectric substrate.

Herewith, the piezoelectric substrate can be ground at faster speed, thereby allowing the improvement in productivity of the piezoelectric thin film device.

It is preferable that the removal process comprise a polishing process for performing polishing processing on the piezoelectric substrate.

Herewith, the quality of the piezoelectric thin film can be improved, thereby allowing the improvement in characteristics of the piezoelectric thin film device.

It is preferable that the bonding process bond the member to the support by an adhesive agent.

Herewith, un-expected formation of an air-space between the member and the substrate can be prevented, thereby allowing the prevention of a crack or the like during removal processing on the piezoelectric substrate.

Further, the present invention is also directed to a piezoelectric thin film device including a single or a plurality of film bulk acoustic resonators.

Accordingly, an object of the present invention is enhancing the degree of flexibility in selection of a piezoelectric material constituting a piezoelectric thin film and the crystal orientation in the piezoelectric thin film, to realize a desired characteristic.

DESCRIPTION OF THE INVENTION

In the following, preferred embodiments of the piezoelectric thin film device of the present invention are described by taking, as an example, a ladder filter (hereinafter referred to as "piezoelectric thin film filter") formed by assembling four film bulk acoustic resonators. However, the embodiments described below do not mean that the piezoelectric thin film device of the present invention is limited to the piezoelectric thin film filter. Namely, the piezoelectric thin film device according to the present invention means piezoelectric thin film devices in general, including a single or a plurality of film bulk acoustic resonators. The piezoelectric thin film device of the present invention includes: an oscillator, a trap, and the like, which include a single film bulk acoustic resonator; and a filter, a duplexer, a triplexer, a trap, and the like, which include a plurality of film bulk acoustic resonators. Here, the film bulk acoustic resonator is a resonator that uses an electric response by means of a bulk acoustic wave excited by a thin film which is so thin as to be unable to stand up under its own weight without a support.

1 First Embodiment

<1.1 Configuration of Piezoelectric Thin Film Filter>

Figure 1:
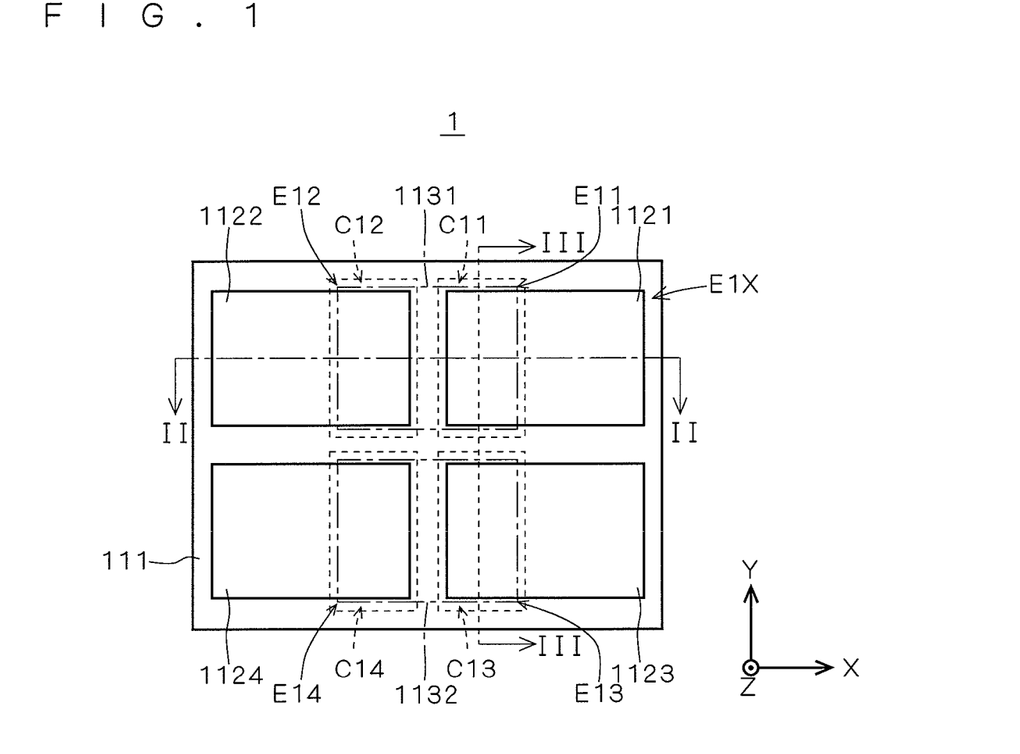
FIG. 1 is a plan view of a piezoelectric thin film filter seen from the top.
Figure 2:
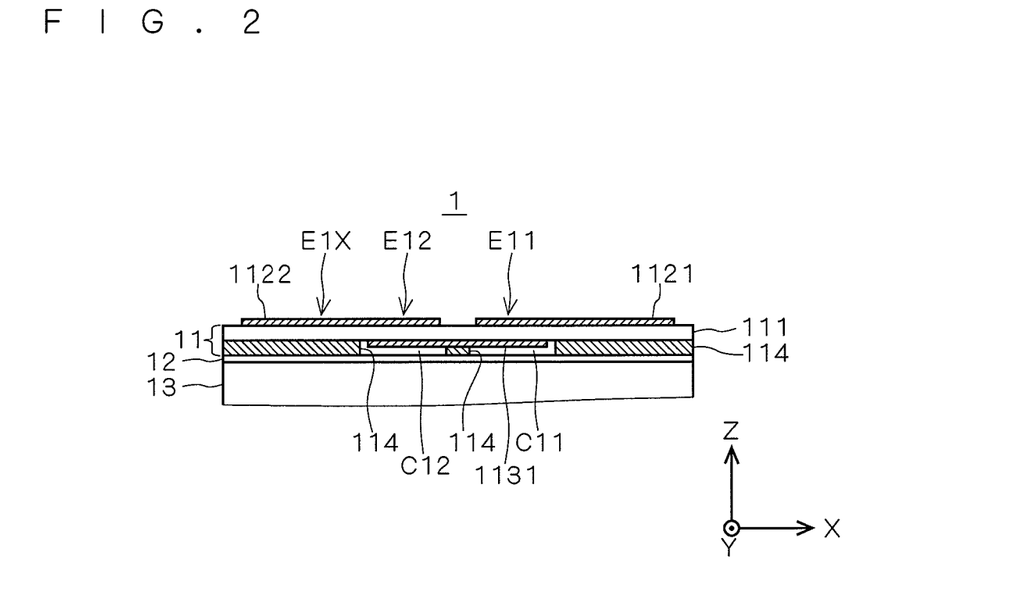
FIG. 2 is a sectional pattern view along a cross section II-II of FIG. 1 seen from the front.
Figure 3:
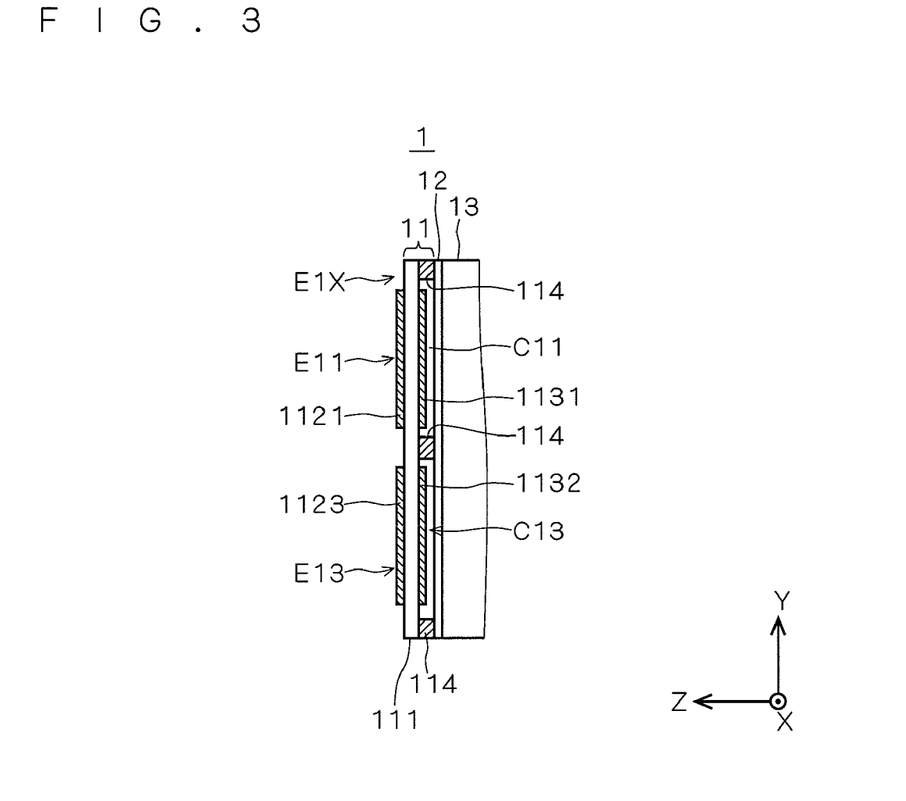
FIG. 3 is a sectional pattern view along a cross section III-III of FIG. 1 seen from the right.
Figure 4:
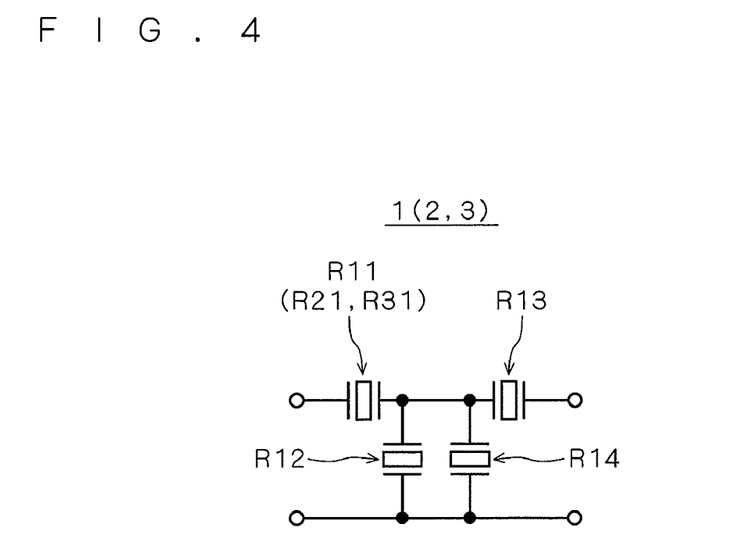
FIG. 4 is a circuit diagram showing an electric connection state of four film bulk acoustic resonators included in the piezoelectric thin film filter.

FIGS. 1 to 4 show a configuration of a piezoelectric thin film filter 1 according to a first embodiment of the present invention. FIG. 1 is a plan view of the piezoelectric thin film filter 1 seen from the top. FIG. 2 is a sectional pattern view along a cross section II-II of FIG. 1 seen from the front (−Y direction). FIG. 3 is a sectional pattern view along a cross section III-III of FIG. 1 seen from the right (+X direction). FIG. 4 is a circuit diagram showing an electric connection state of four film bulk acoustic resonators R11 to R14 included in the piezoelectric thin film filter 1. It is be noted that in FIGS. 1 to 3, an XYZ orthogonal coordinate system is defined for the sake of simplicity where the right-and-left direction is ±X-axis direction, the front-and-back direction is ±Y-axis direction, and the top-and bottom-direction is ±Z-axis direction.

As shown in FIGS. 1 to 3, the piezoelectric thin film filter 1 has a configuration where a filter section 11 for providing a filter function of the piezoelectric thin film filter 1 is bonded with a flat base substrate 13 mechanically supporting the filter section 11 via an adhesive layer 12. In manufacture of the piezoelectric thin film filter 1, a piezoelectric thin film 111 is obtained by performing removal processing on an piezoelectric substrate that can independently stand up under its own weight, but the piezoelectric thin film 111 obtained by removal processing cannot independently stand up under its own weight. For this reason, in manufacture of the piezoelectric thin film filter 1, a prescribed member including a piezoelectric substrate are previously bonded to the base substrate 13 as a support prior to the removal processing <1.1.1 Filter Section>

The filter section 11 comprises: a piezoelectric thin film 111, upper electrodes 1121 to 1124, formed on the top surface of the piezoelectric thin film 111; lower electrodes 1131 and 1132, formed on the bottom surface of the piezoelectric thin film 111; and a cavity formation film 114 for forming cavities C11 to C14 below excitation regions E11 to E14 where the upper electrodes 1121 to 1124 and the lower electrodes 1131 and 1132 are opposed to each other with the piezoelectric thin film 111 interposed therebetween. Piezoelectric thin film:

The piezoelectric thin film 111 is obtained by performing removal processing on the piezoelectric substrate. More specifically, the piezoelectric thin film 111 is obtained such that a piezoelectric substrate having thickness (e.g. not less than 50 μm) large enough to individually stand up under its own weight is made thinner by removal processing, to have thickness (e.g. not more than 10 μm) not large enough to individually stand up under its own weight. Further, in a case where the excitation region is circular, its diameter is in the range of 30 to 300 μm, and in a case where the excitation region is polygonal, its longest diagonal line is in the range of 30 to 300 μm.

As a piezoelectric material constituting the piezoelectric thin film 111, a piezoelectric material having a desired piezoelectric property can be selected, and it is desirable to select a single-crystal material including no grain boundary, such as quartz crystal ($SiO_2$), lithium niobate ($LiNbO_3$), lithium tantalite ($LiTaO_3$), lithium tetraborate ($Li_2B_4O_7$), zinc oxide (ZnO), potassium niobate ($KNbO_3$), or langasite ($La_3Ga_3SiO_{14}$). This is because the use of the single-crystal material as the piezoelectric material constituting the piezoelectric thin film 111 improves the mechanical quality coefficient of the piezoelectric thin film 111 to allow the realization of a piezoelectric thin film filter 1 with low loss and a favorable skirt characteristic, and also improves the electromechanical coupling coefficient of the piezoelectric thin film 111 to allow the realization of a wide bandwidth piezoelectric thin film filter 1.

Further, a crystal orientation in the piezoelectric thin film 111 can be selected to be a crystal orientation having a desired piezoelectric characteristic. When the crystal orientation in the piezoelectric thin film 111 is a crystal orientation that leads to favorable temperature characteristics of resonance frequencies and antiresonance frequencies of the film bulk acoustic resonators R11 to R14, and is desirably a crystal orientation in which a resonance frequency temperature coefficient is "0", it is possible to realize a piezoelectric thin film filter 1 having a favorable temperature characteristic of a center frequency in a pass band or the like.

The removing process of a piezoelectric substrate 15 is performed by mechanical processing such as cutting, grinding or polishing, or chemical processing such as etching. Here, if an piezoelectric substrate is subjected to removal processing where a plurality of removal processing methods are combined and the removal processing method is shifted in stages from a removal processing method performed at high processing speed to a removal processing method with small process degradation that occurs in an object to be processed, it is possible to improve the quality of the piezoelectric thin film 111 while maintaining high productivity, thereby enabling improvement in characteristics of the piezoelectric thin film filter 1. For example, the piezoelectric substrate is subjected to grinding where the substrate is brought into contact with fixed abrasive grains for grinding, and is then subjected to polishing where the substrate is brought into contact with free abrasive grains for grinding. Thereafter, a process degradation layer generated in the piezoelectric substrate by above-mentioned polishing is removed by finish-polishing. If such processes are executed, the piezoelectric substrate can be ground at faster speed so as to improve productivity of the piezoelectric thin film filter 1, and also, the quality of the piezoelectric thin film 111 can be improved so as to improve the characteristics of the piezoelectric thin film filter 1. It is to be noted that more specific methods for removal processing on the piezoelectric substrate are described in later-described examples.

In the piezoelectric thin film filter 1, the thickness of the piezoelectric thin film 111 is constant in the excitation regions E11 to E14 and a non-excitation region E1X. Hence the piezoelectric thin film filter 1 has a configuration suitable for frequency lowering type energy trapping.

In such a piezoelectric thin film filter 1, different from the case of forming the piezoelectric thin film 111 by sputtering or the like, since the piezoelectric material constructing the piezoelectric thin film 111 and the crystal orientation in the piezoelectric thin film 111 are free from constraints of the substrate, the degree of flexibility is high in selection of the piezoelectric material constructing the piezoelectric thin film 111 and the crystal orientation in the piezoelectric thin film 111. This facilitates realization of a desired characteristic in the piezoelectric thin film 111.

Upper Electrode and Lower Electrode

The upper electrodes 1121 to 1124 and the lower electrodes 1131 and 1132 are conductive thin films obtained by formation of films of a conductive material.

The thicknesses of the upper electrodes 1121 to 1124 and the lower electrodes 1131 and 1132 are determined in consideration of adhesiveness to the piezoelectric thin film 111, electric resistance, withstand power, and the like. It is to be noted that in order to suppress variations in resonance frequencies and antiresonance frequencies of the film bulk acoustic resonators R11 to R14 caused by variations in acoustic velocity as well as film thickness of the piezoelectric thin films 111, the thicknesses of the upper electrodes 1121 to 1124 and the lower electrodes 1131 and 1132 may be adjusted as appropriate. Further, in order to control the degree of energy trapping, the film thicknesses of excitation regions E11 to E14 may be made different from that of the non-excitation region E1X.

Although a conductive material constructing the upper electrodes 1121 to 1124 and the lower electrodes 1131 and 1132 is not particularly limited, it is desirable to select the material from metal such as aluminum (Al), silver (Ag), copper (Cu), platinum (Pt), gold (Au), chromium (Cr), nickel (Ni), molybdenum (Mo) and tungsten (W), and it is particularly desirable to select aluminum having excellent stability. Naturally, an alloy may be used as the conductive material constructing the upper electrodes 1121 to 1124 and the lower electrodes 1131 and 1132. Moreover, a plurality of various kinds of conductive materials may be stacked to form films, to form the upper electrodes 1121 to 1124 and the lower electrodes 1131 and 1132.

In the piezoelectric thin film filter 1, four upper electrodes 1121 to 1124 each in rectangular shape are formed on the top surface of the piezoelectric thin film 111, and two lower electrodes 1131 and 1132 each in rectangular shape are formed on the bottom surface of the piezoelectric thin film 111. The four upper electrodes 1121 to 1124 are arranged in two rows and two lines so as to be symmetrical in vertical and horizontal directions inside the top surface of the piezoelectric thin film 111. The two lower electrodes 1131 and 1132 are arranged in two rows and one line so as to be symmetrical in vertical and horizontal directions inside the bottom surface of the piezoelectric thin film 111.

The upper electrodes 1121 and 1122 are opposed to the lower electrode 1131 with the piezoelectric thin film 111 interposed therebetween in the excitation regions E11 and E12. Further, the upper electrodes 1123 and 1124 are opposed to the lower electrode 1132 with the piezoelectric thin film 111 interposed therebetween in the excitation regions E 13 and E 14. Thereby, in the piezoelectric thin film filter 1, two film bulk acoustic resonators R11 and R12 are formed, with the respective ends being the upper electrodes 1121 and 1122 and the common other end being the lower electrode 1131, and two film bulk acoustic resonators R13 and R14 are formed, with the respective ends being the upper electrodes 1123 and 1124 and the common other end being the lower electrode 1132. A mode of vibration used in these film bulk acoustic resonators R11 to R14 are not particularly limited, and can be selected from a thickness extension vibration of bulk waves, a thickness shear vibration of bulk waves, and the like.

Cavity Formation Film

The cavity formation film 114 is an insulating film obtained by forming a film of an insulating material. The cavity formation film 114 is formed on the bottom surface of the non excitation region E1X of the piezoelectric thin film 111, and forms the cavities C11 to C14 for separating the excitation regions E11 to E14 of the piezoelectric thin film 111 from the base substrate 13. Since vibrations of the film bulk acoustic resonators R11 to R14 do not interfere with the base substrate 13 due to the cavity formation film 114 which serves as a spacer as thus described, it is possible to improve the characteristics of the piezoelectric thin film filter 1.

The insulating material constructing the cavity formation film 114 is not particularly limited, but is desirably selected from an insulating material such as silicon dioxide ($SiO_2$).

<1.1.2 Adhesive Layer>

The adhesive layer 12 serves to bond and fix the piezoelectric substrate, on the bottom surface of which the lower electrodes 1131 and 1132 and the cavity formation film 114 is formed, to the base substrate 13 when the piezoelectric substrate is subjected to removal processing during the manufacture of the piezoelectric thin film filter 1. Additionally, the adhesive layer 12 also serves to bond and fix the piezoelectric thin film 111, on the bottom surface of which the lower electrodes 1131 and 1132 and the cavity formation film 114 are formed and on the top surface of which the upper electrodes 1121 to 1124 are formed, to the base substrate 13 after the manufacture of the piezoelectric thin film filter 1. Therefore, the adhesive layer 12 is required to be capable of withstanding force applied at the time of the removal processing on the piezoelectric substrate and to have adhesive force that is not reduced after the manufacture of the piezoelectric thin film filter 1.

A desirable example of an adhesive layer 12 satisfying such requirements may be an adhesive layer 12 formed of an organic adhesive agent, desirably an epoxy adhesive agent (thermosetting epoxy resin) or an acryl adhesive agent (acryl resin using both hot-curing and photo-curing), which has a filling effect and exerts sufficient adhesive force even when an object to be bonded is not completely flat. Adoption of such a resin can prevent unexpected formation of an air space between the cavity formation film 114 and the base substrate 13, thereby preventing the occurrence of cracking or the like at the time of the removal processing on the piezoelectric substrate due to the air space. However, this does not prevent the filter section 11 and the base substrate 13 from being bonded and fixed to each other by the adhesive layer 12 other than the above mentioned adhesive layer 12. For example, the cavity formation film 114 of the filter section 11 and the base substrate 13 may be bonded and fixed to each other by a diffusion bonding layer.

<1.1.3 Base Substrate>

The base substrate 13 serves as a support for supporting the piezoelectric substrate, on the bottom surface of which the lower electrodes 1131 and 1132 and the cavity formation film 114 are formed, via the adhesive layer 12 at the time of the removal processing on the piezoelectric substrate during the manufacture of the piezoelectric thin film filter 1. Additionally, the base substrate 13 also serves as a support for supporting, via the adhesive layer 12, the piezoelectric thin film 111 on the bottom surface of which the lower electrodes 1131 and 1132 and the cavity formation film 114 are formed and on the top surface of which the upper electrodes 1121 to 1124 are formed. Therefore, the base substrate 13 is also required to be capable of withstanding force applied at the time of the removal processing on the piezoelectric substrate and to have adhesive force that is not reduced after the manufacture of the piezoelectric thin film filter 1.

The thickness of the base substrate 13 can be changed as appropriate so as to satisfy the above-mentioned requirements. If the material for the base substrate 13 is a material having a thermal expansion coefficient close to that of the piezoelectric material constructing the piezoelectric thin film 111, more preferably a material having a thermal expansion coefficient equivalent to that of the piezoelectric material constructing the piezoelectric thin film 111, (e.g. the same material as the piezoelectric material constructing the piezoelectric thin film 111), it is possible to suppress warpage and damage caused by a difference in thermal expansion coefficient during the manufacture of the piezoelectric thin film filter 1. It is further possible to suppress characteristic variations and damage caused by a difference in thermal expansion coefficient after the manufacture of the piezoelectric thin film filter 1. It is to be noted that in the case of using a material having an anisotropic thermal expansion coefficient, it is desirable to see that the thermal expansion coefficients in all different directions are made the same.

2 Second Embodiment

<2.1 Configuration of Piezoelectric Thin Film Filter>

A piezoelectric thin film filter 2 according to a second embodiment of the present invention has a similar configuration to that of the piezoelectric thin film filter 1 according to Embodiment 1, but a cavity formation method for the piezoelectric thin film filter 2 differs from that for the piezoelectric thin film filter 1.

A description is made with a focus on one film bulk acoustic resonator R21 included in the piezoelectric thin film filter 2. As shown in a sectional pattern view of FIG. 5, the piezoelectric thin film filter 2 comprises: a upper electrode 2121; a piezoelectric thin film 211; a lower electrode 2131; an adhesive layer 22 and a base substrate 23, corresponding to the upper electrode 1121; the piezoelectric thin film 111; the lower electrode 1131; the adhesive layer 12 and the base substrate 13 respectively. Further, in the piezoelectric thin film filter 2, a lower electrode 2135 as a dummy electrode is formed on the bottom surface of a piezoelectric thin film 21 such that the piezoelectric thin film 211 is brought into the state of being opposed in parallel to the base substrate 23.

Figure 5:
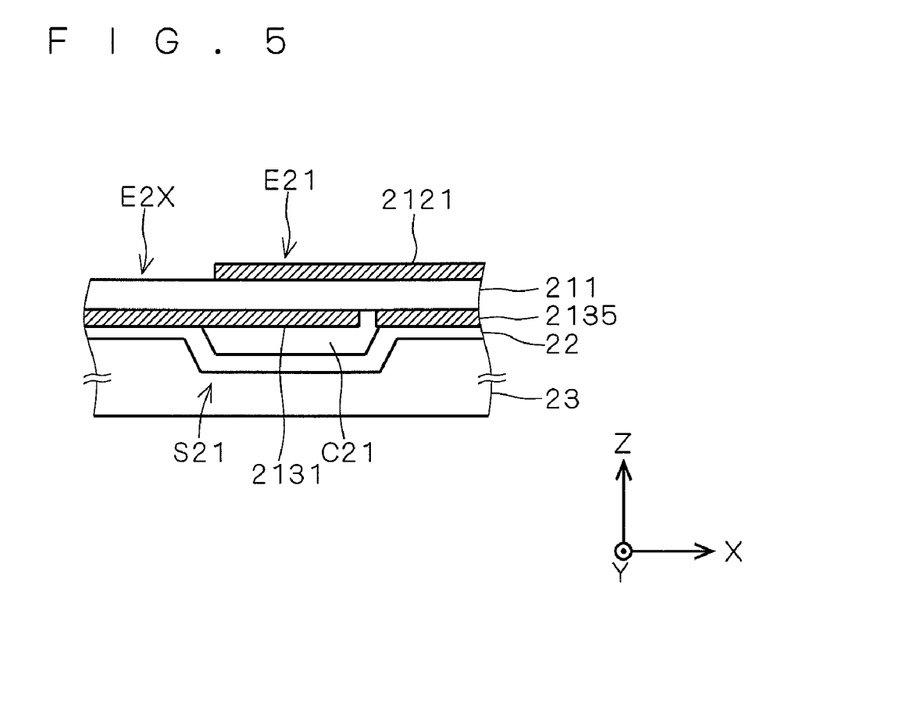
FIG. 5 is a sectional pattern view of a film bulk acoustic resonator included in a piezoelectric thin film filter.

However, the piezoelectric thin film filter 2 does not have a configuration corresponding to that of the cavity formation film 114. Instead, the piezoelectric thin film filter 2 has a configuration where a depression (concave portion) S21 forming a cavity C21 is formed in a prescribed region of the base substrate 23 opposed to an excitation region E21 of the piezoelectric thin film 211 such that vibrations of the film bulk acoustic resonator R21 do not interfere with the base substrate 23.

Also in the piezoelectric thin film filter 2, the thickness of the piezoelectric thin film 211 is constant in the excitation region E21 and a non-excitation region E2X. Hence the piezoelectric thin film filter 2 has a configuration suitable for frequency lowering type energy trapping.

3 Third Embodiment

<3.1 Configuration of Piezoelectric Thin Film Filter>

A piezoelectric thin film filter 3 according to a third embodiment of the present invention has a similar configuration to that of the piezoelectric thin film filter 1 according to Embodiment 1, but a cavity formation method for the piezoelectric thin film filter 3 differs from that for the piezoelectric thin film filter 1.

A description is made with a focus on one film bulk acoustic resonator R31 included in the piezoelectric thin film filter 3. As shown in a sectional pattern view of FIG. 6, the piezoelectric thin film filter 3 comprises: a upper electrode 3121; a piezoelectric thin film 311; a lower electrode 3131; an adhesive layer 32 and a base substrate 33, corresponding to the upper electrode 1121; the piezoelectric thin film 111; the lower electrode 1131; the adhesive layer 12 and the base substrate 13 respectively.

Figure 6:
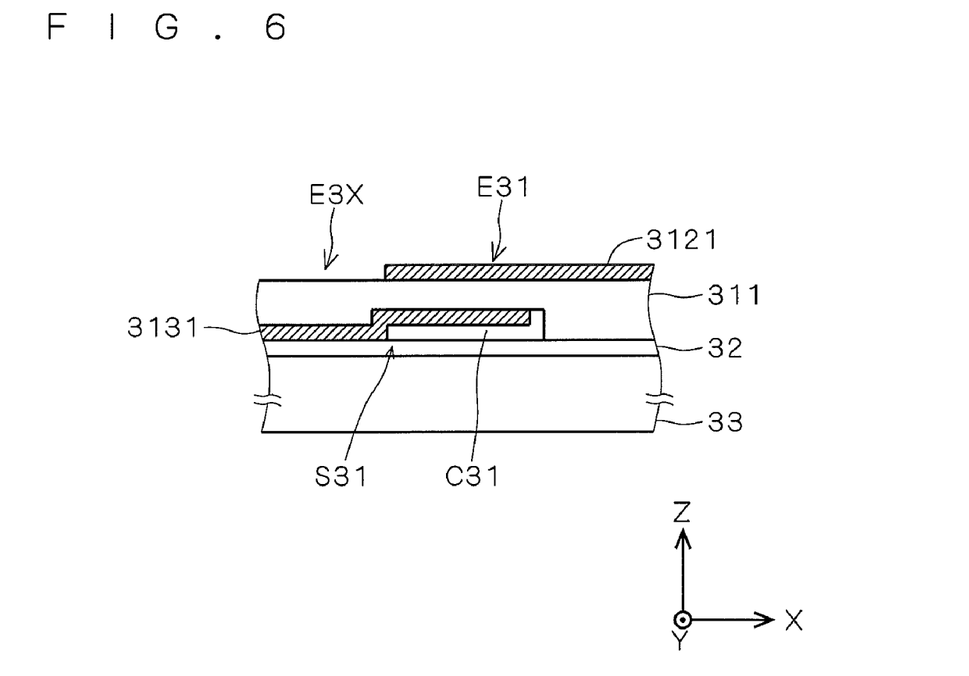
FIG. 6 is a sectional pattern view of the film bulk acoustic resonator included in the piezoelectric thin film filter.

However, the piezoelectric thin film filter 3 does not have a configuration corresponding to that of the cavity formation film 114. Instead, the piezoelectric thin film filter 3 has a configuration where a depression (concave portion) S31 forming a cavity C31 is formed on the bottom surface of the excitation region E31 of the piezoelectric thin film 311 such that vibrations of the film bulk acoustic resonator R31 do not interfere with the base substrate 33.

In the piezoelectric thin film filter 3, the thickness of the excitation region E31 is smaller than that of a non-excitation region E3X. Hence the piezoelectric thin film filter 3 has a configuration suitable for frequency heightening type energy trapping.

EXAMPLES

In the following described are Examples 1 to 3 according to the first to third embodiments of the present invention and Comparative Example 1 out of the range of the present invention.

Example 1

In Example 1 according to the first embodiment of the present invention, the piezoelectric thin film filter 1 was produced using: a single crystal of lithium niobate as the piezoelectric material constructing the piezoelectric thin film 111 and the base substrate 13; aluminum as the conductive material constructing the upper electrodes 1121 to 1124 and the lower electrodes 1131 and 1132; silicon dioxide as the insulating material constructing the cavity formation film 114; and an epoxy adhesive agent as the material constructing the adhesive layer 12.

Figure 7:
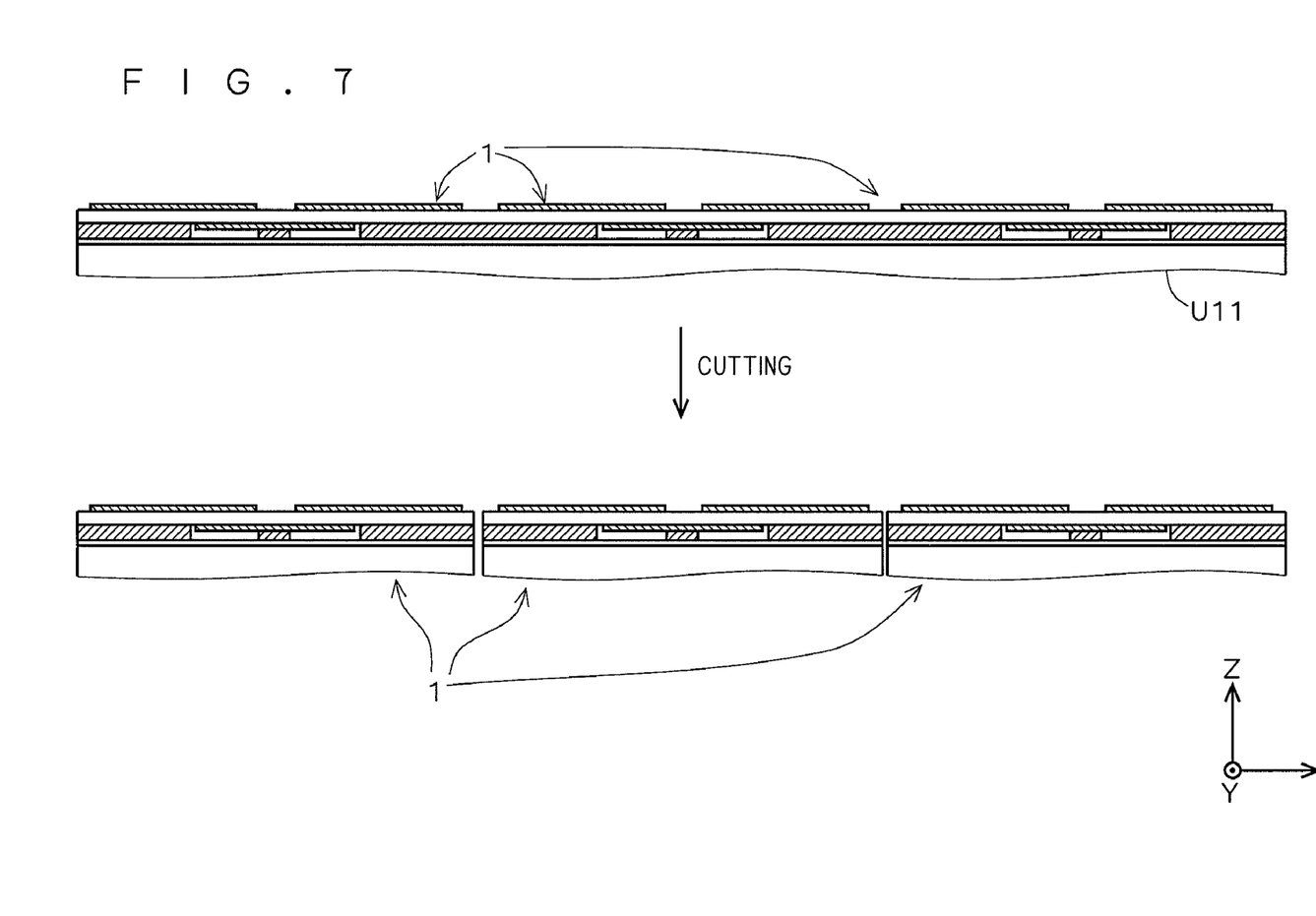
FIG. 7 is a sectional pattern view showing how an assembly, formed by integrating a large number of piezoelectric thin film filters, is separated into individual piezoelectric thin film filters.

As shown in a sectional pattern view of FIG. 7, in order to reduce manufacturing cost, the piezoelectric thin film filter 1 of Example 1 is obtained in the following manner. After production of an assembly U11 by integration of a large number of piezoelectric thin film filters 1, the assembly U11 is cut by a dicing saw into individual piezoelectric thin film filters 1. It is to be noted that, although the example of including three piezoelectric thin film filters 1 in the assembly U11 is shown in FIG. 7, the number of piezoelectric thin film filters 1 included in the assembly U11 may be four or larger, and typically, several hundreds to several thousands of piezoelectric thin film filters 1 are included in the assembly U11.

Subsequently, a method for producing the piezoelectric thin film filter 1 of Example 1 is described with reference to FIGS. 8 and 9. Although a description is made with focus on the two film bulk acoustic resonators R11 and R12 included in the assembly U11 for the sake of simplicity, other film bulk acoustic resonators included in the assembly U11 are produced simultaneously with the film bulk acoustic resonators R11 and R12.

Figure 8:
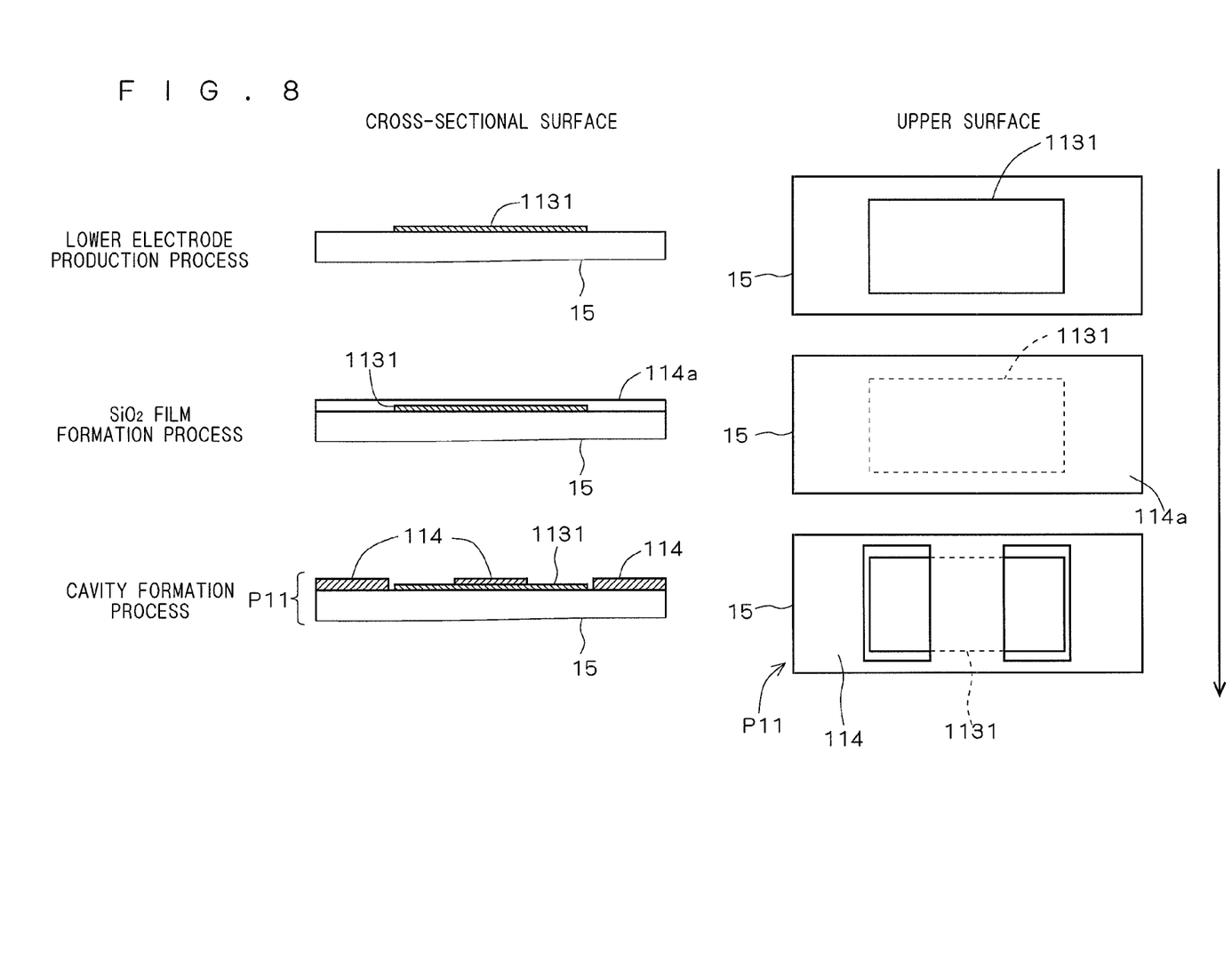
FIG. 8 is a view showing the flow of manufacture of the piezoelectric thin film filter according to Example 1.

With reference to FIG. 8, first, a circular wafer (36-degree-cut Y plate) of a single crystal of lithium niobate having a thickness of 0.5 mm and a diameter of 3 inches was prepared as the piezoelectric substrate 15 and the base substrate 13.

An aluminum film having a thickness of 1000 angstrom was formed by sputtering all over one main surface of the piezoelectric substrate 15, and the lower electrode 1131 was patterned by etching using a typical photolithography process [lower electrode production process].

Next, a silicon dioxide film 114a having a thickness of 1 µm was formed by sputtering all over the main surface of the piezoelectric substrate 15 where the lower electrode 1131 was formed [SiO₂ film formation process]. Then, the silicon dioxide film formed in a prescribed region of the piezoelectric substrate 15 as the excitation regions E11 and E12 in the piezoelectric thin film 111 was removed by wet etching using hydrofluoric acid. Thereby, the cavity formation film 114 forming the cavities C11 and C12 was formed in a prescribed region of the piezoelectric substrate 15 as a non-excitation region E1X in the piezoelectric thin film 111 [cavity formation process].

Figure 9:
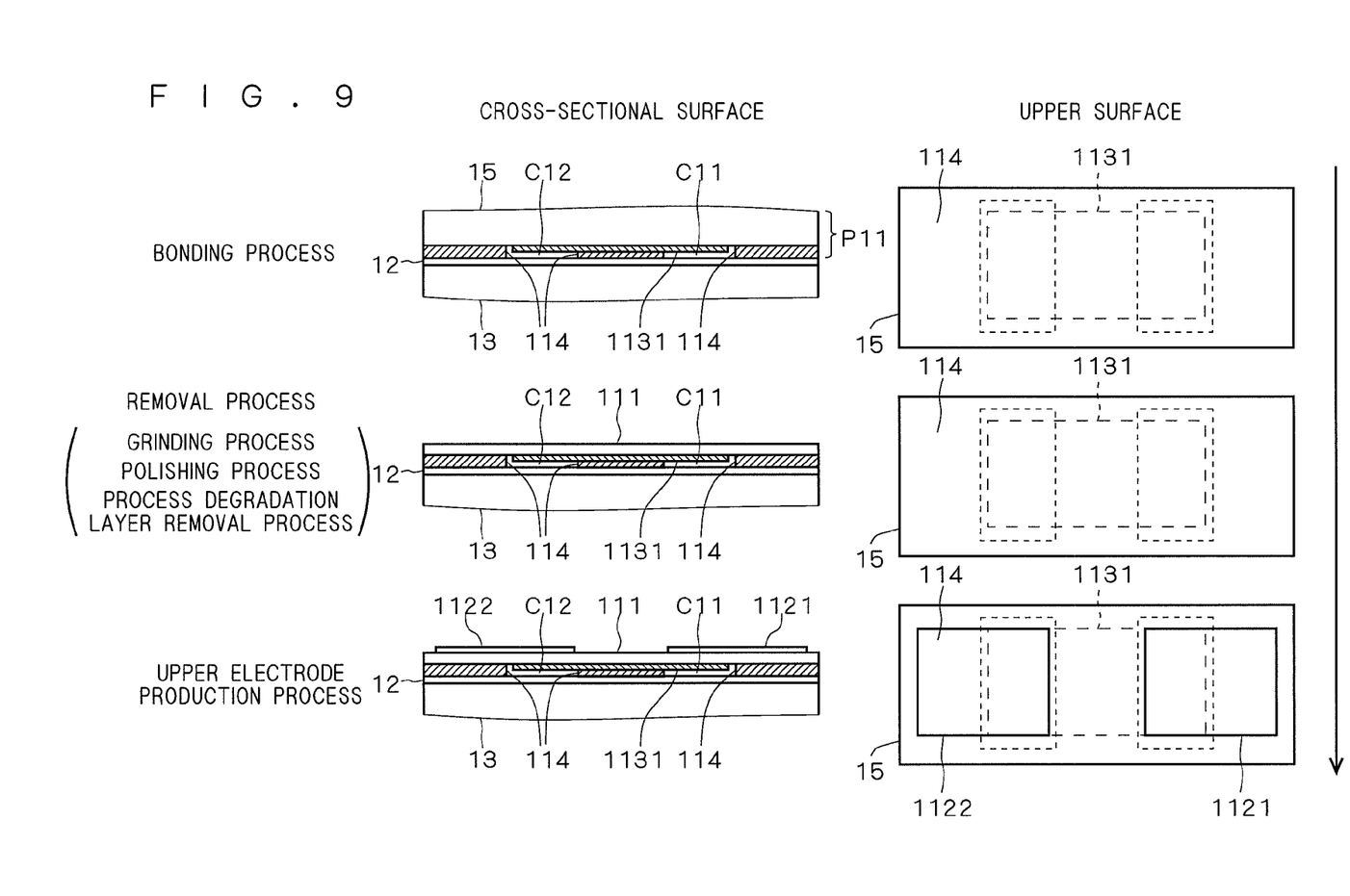
FIG. 9 is a view showing the flow of manufacture of the piezoelectric thin film filter according to Example 1.

With reference to FIG. 9 which illustrates turning over a member P11 produced by the lower electrode production process, SiO$_2$ film formation process and the cavity formation process, the epoxy adhesive agent as the adhesive layer 12 is applied to the whole of one main surface of the base substrate 13, and the main surface of the base substrate 13 to which the epoxy adhesive agent was applied and the cavity formation film 114 of the member P11 were bonded to each other. Subsequently, pressure was applied to the base substrate 13 and the piezoelectric substrate 15 for press pressure bonding, to make the adhesive layer 12 have a thickness of 0.5 μm. Thereafter, the bonded base substrate 13 and the member P11 were left to stand in an 200° C. environment for one hour for curing by use of the epoxy adhesive agent, so as to bond the substrate 13 and the cavity formation film 114 of the filter section 11 with each other [bonding process]. Thereby, the member P11 was bonded to the base substrate 13, and the cavities C11 and C12, having a rectangular shape 50 μm wide by 100 μm long and a depth of about 1 μm, were formed below a prescribed region of the piezoelectric substrate 15 as the excitation regions E11 and E12 in the piezoelectric thin film 111.

After completion of bonding/fixing of the base substrate 13 and the member P11, while the member P11 was kept in the state of being bonded and fixed to the base substrate 13, the other main surface of the base substrate 13 was bonded and fixed to a polishing jig made of silicon carbide (SiC), and the other main surface of the piezoelectric substrate 15 was subjected to grinding processing using a grinding machine with fixed abrasive grains, to reduce the thickness of the piezoelectric substrate 15 to 50 μm. The other main surface of the piezoelectric substrate 15 was subjected to polishing processing using diamond abrasive grains, to reduce the thickness of the piezoelectric substrate 15 to 2 μm. Finally, for removing a process degradation layer generated on the piezoelectric substrate 15 by polishing processing using the diamond abrasive grains, free abrasive grains and a non-woven polishing pad were used to perform finish-polishing on the piezoelectric substrate 15, so as to obtain the piezoelectric thin film 111 having a thickness of 1.00 (±0.01) μm [removal process].

Furthermore, the polished surface of the piezoelectric thin film 111 was washed using an organic solvent, and an aluminum film having a thickness of 1000 angstrom was formed all over the polished surface. The upper electrodes 1121 and 1122 were then patterned by etching, using the typical photolithography process [upper electrode production process].

In the piezoelectric thin film filter 1 as thus obtained, a frequency impedance characteristic of the film bulk acoustic resonator R11 was measured, and a vibration response of a thickness extension vibration was estimated, to obtain a resonance frequency of 1.95 GHz, an antiresonance frequency of 2.10 GHz, and a mechanical quality coefficient of 980. Further, in the range of 1.90 to 2.20 GHz, spuriousness caused by sub-resonance was observed. In addition, when a temperature characteristic of the resonance frequency at −20 to 80° C. was evaluated by means of a frequency temperature coefficient, the evaluated value was 70 ppm/° C.

Example 2

Example 2 according to the second embodiment of the present invention is different from Example 1 in that, instead of executing the SiO$_2$ film formation process and the cavity formation process, the depression S21 forming the cavity C21 is formed in a prescribed region of the base substrate 23 opposed to the excitation region E21 of the piezoelectric thin film 211 prior to the bonding process.

Figure 10:
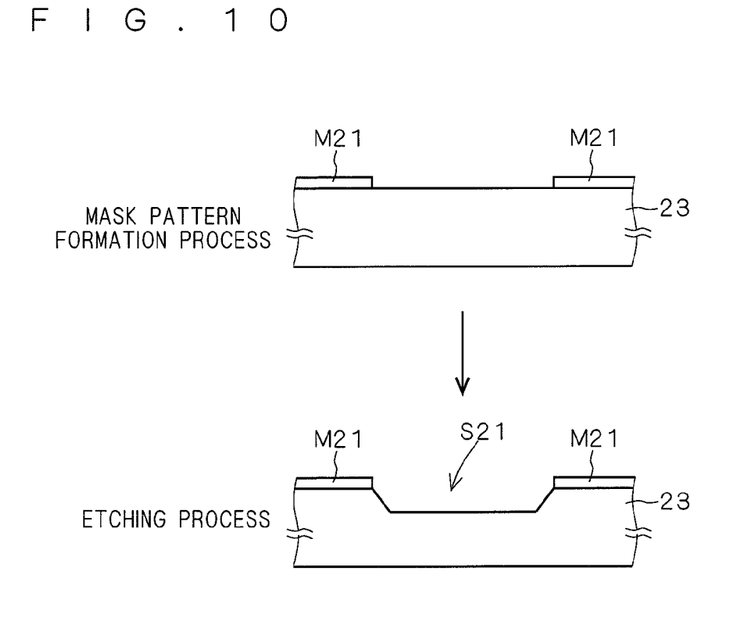
FIG. 10 is a sectional pattern view for explaining a depression formation process.

A depression formation process for forming the depression S21 is described with reference to a sectional pattern view of FIG. 10. First, a molybdenum film having a thickness of 2 μm was formed all over one main surface of the base substrate 23 by sputtering, and a mask pattern M21 exposing only a portion of the base substrate 23, where the depression S21 was to be formed, and covering the remnant portion was formed by photolithography and wet etching [mask pattern formation process].

Thereafter, the base substrate 23 was etched using hydrofluoric acid heated to 60° C. and the depression S21, having a rectangular shape 50 μm wide by 100 μm long and a depth of about 1 μm, was formed on the base substrate 23 [etching process].

In the piezoelectric thin film filter 2 as thus obtained, a frequency impedance characteristic of the film bulk acoustic resonator R21 was measured, and a vibration response of a thickness extension vibration was estimated, to obtain a resonance frequency of 1.95 GHz, an antiresonance frequency of 2.10 GHz, and a mechanical quality coefficient of 980. Further, in the range of 1.90 to 2.20 GHz, spuriousness caused by sub-resonance was observed. In addition, when a temperature characteristic of the resonance frequency at −20 to 80° C. was evaluated by means of a frequency temperature coefficient, the evaluated value was 70 ppm/° C.

Example 3

Example 3 according to the third embodiment of the present invention is different from Example 1 in that, instead of executing the SiO$_2$ film formation process and the cavity formation process, the depression (concave portion) S31 forming the cavity C31 is formed in a prescribed region of the piezoelectric substrate 35 as the excitation region E31 in the piezoelectric thin film 311.

Figure 11:
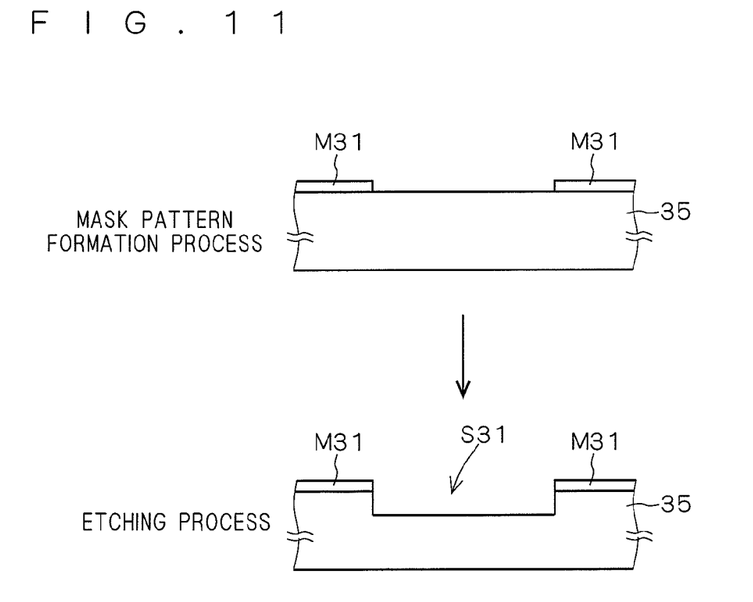
FIG. 11 is a sectional pattern view for explaining the depression formation process.

A depression formation process for forming the depression S31 is described with reference to a sectional pattern view of FIG. 11. First, a gold film having a thickness of 1 μm was formed all over one main surface of the piezoelectric substrate 35 by sputtering, and a mask pattern M31 exposing only a portion of the piezoelectric substrate 35, where the depression S31 was to be formed, and covering the remnant portion was formed by photolithography and wet etching [mask pattern formation process].

Thereafter, the piezoelectric substrate 35 was heated to 60° C. and etched, and the depression S31, having a rectangular shape 50 μm wide by 100 μm long and a depth of about 1 μm, was formed on the piezoelectric substrate 35 [etching process].

In the piezoelectric thin film filter 3 as thus obtained, a frequency impedance characteristic of the film bulk acoustic resonator R31 was measured, and a vibration response of a thickness extension vibration was estimated, to obtain a resonance frequency of 1.95 GHz, an antiresonance frequency of 2.15 GHz, and a mechanical quality coefficient of 980. Further, in the range of 1.90 to 2.20 GHz, spuriousness caused by sub-resonance was not observed.

Comparative Example 1

In Comparative Example 1, a piezoelectric thin film filter having a sectional configuration shown in FIG. 12 was produced. In production of the piezoelectric thin film filter, first, a three-inch wafer of a silicon (Si) single crystal (111 face) with a thickness of 0.5 mm was used as a base substrate 91, and silicon nitride film having a thickness of 1 μm was formed by sputtering all over the main surface of the base substrate 91. Next, an aluminum film having a thickness of 1000 angstrom was formed by sputtering on the silicon nitride film, and a lower electrode 93 was patterned by etching using the typical photolithography process.

Next, a lithium niobate film having a thickness of 1 μm was formed by sputtering on the lower electrode 93, to obtain a c-axis oriented piezoelectric thin film 94.

Subsequently, an aluminum film having a thickness of 1000 angstrom was formed by sputtering on the piezoelectric thin film 94, and a lower electrode 95 was patterned by etching using the typical photolithography process.

On the other hand, a chromium film was formed by sputtering on the other main surface of the base substrate 91, and a mask pattern exposing only a portion of the base substrate 91, where a cavity C91 was to be formed, and covering the remnant portion was formed by photolithography and wet etching.

Thereafter, the base substrate 91 was etched using hydrofluoric acid heated to 60° C. and the cavity C91, having a rectangular shape 50 μm wide by 100 μm long, was formed on the base substrate 91.

In the piezoelectric thin film filter as thus obtained, a frequency impedance characteristic of the film bulk acoustic resonator was measured, and a vibration response of a thickness extension vibration was estimated, to obtain a resonance frequency of 1.95 GHz, an antiresonance frequency of 2.00 GHz, and a mechanical quality coefficient of 240.

As apparent from the foregoing descriptions, in Examples 1 to 3, the difference between the resonance frequency and the antiresonance frequency significantly increases from the difference of 50 MHz in Comparative Example 1 to a difference of 150 to 200 MHz in Examples 1 to 3, thereby a significant increase in electromechanical coupling coefficient has thus been realized. Further, in Examples 1 to 3, the mechanical quality coefficient significantly increases from the coefficient of 240 in Comparative Example 1 to 980 in Example 3. In addition, in Example 3, the suppression of spuriousness caused by sub-resonance was accomplished by energy trapping.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a piezoelectric thin film device that includes a single or a plurality of film bulk acoustic resonators, comprising:
    a production process for producing a member that includes a piezoelectric substrate, wherein the production process comprises a depression formation process for forming a depression that makes a thickness of an excitation region of the piezoelectric substrate smaller than a thickness of a non-excitation region in a prescribed region of the piezoelectric substrate;
    a bonding process for bonding said member to a support, wherein the formed depression separates the excitation region of the piezoelectric substrate from the support in a prescribed region of the support, where the prescribed region of the support is opposed to the excitation region of the piezoelectric substrate; and
    a removal process for performing removal processing on the piezoelectric substrate while keeping said member bonded to the support, to obtain a piezoelectric thin film.

2. The method for manufacturing the piezoelectric thin film device according to claim 1,
    wherein the removal process comprises a grinding process for performing grinding processing on the piezoelectric substrate.

3. The method for manufacturing a piezoelectric thin film device according to claim 1,
    wherein the removal process comprises a polishing process for performing polishing processing on the piezoelectric substrate.

4. The method for manufacturing the piezoelectric thin film device according to claim 1,
    wherein the bonding process bonds said member to the support by an adhesive agent.

5. The method for manufacturing the piezoelectric thin film device according to claim 1,
    wherein the production process comprises a film formation process for forming a film of the piezoelectric substrate.

6. The method for manufacturing the piezoelectric thin film device according to claim 1,
    wherein a thermal expansion coefficient of the piezoelectric thin film is the same as a thermal expansion coefficient of the support.

* * * * *